United States Patent
Bae

(10) Patent No.: US 9,882,512 B2
(45) Date of Patent: Jan. 30, 2018

(54) PIEZOELECTRIC ELEMENT FOR POWER GENERATION AND POWER GENERATION DEVICE USING SAME

(71) Applicant: Sang-Cheol Bae, Daegu (KR)

(72) Inventor: Sang-Cheol Bae, Daegu (KR)

( * ) Notice: Subject to any disclaimer, the term of this patent is extended or adjusted under 35 U.S.C. 154(b) by 379 days.

(21) Appl. No.: 14/431,183

(22) PCT Filed: Sep. 24, 2013

(86) PCT No.: PCT/KR2013/008502
§ 371 (c)(1),
(2) Date: Mar. 25, 2015

(87) PCT Pub. No.: WO2014/051299
PCT Pub. Date: Apr. 3, 2014

(65) Prior Publication Data
US 2015/0256107 A1 Sep. 10, 2015

(30) Foreign Application Priority Data
Sep. 25, 2012 (KR) .................. 10-2012-0106246
Sep. 25, 2012 (KR) .................. 10-2012-0106247

(51) Int. Cl.
*H01L 41/113* (2006.01)
*H02N 2/18* (2006.01)
*F03B 7/00* (2006.01)
*F03B 13/14* (2006.01)
*F03B 13/18* (2006.01)

(52) U.S. Cl.
CPC .............. *H02N 2/183* (2013.01); *F03B 7/00* (2013.01); *F03B 13/14* (2013.01); *F03B 13/184* (2013.01); *H01L 41/113* (2013.01); *H02N 2/18* (2013.01); *F05B 2220/709* (2013.01); *Y02E 10/38* (2013.01)

(58) Field of Classification Search
CPC ......... H01L 41/113; H02N 2/183; F03B 7/00; F03B 13/14; F03B 13/184
USPC .................. 310/311, 324, 328–332, 339
See application file for complete search history.

(56) References Cited

U.S. PATENT DOCUMENTS

| | | | | |
|---|---|---|---|---|
| 4,755,975 A | * | 7/1988 | Ito ........................ | H04R 17/00 310/322 |
| 5,801,475 A | * | 9/1998 | Kimura ................. | G01P 13/00 310/319 |
| 7,034,440 B2 | * | 4/2006 | Kim ...................... | H02N 2/18 310/324 |
| 7,812,508 B2 | * | 10/2010 | Abramovich .......... | H02N 2/18 310/339 |

(Continued)

FOREIGN PATENT DOCUMENTS

| | | |
|---|---|---|
| JP | H0749388 | 2/1995 |
| JP | 2004130270 | 4/2004 |

(Continued)

*Primary Examiner* — Thomas Dougherty
(74) *Attorney, Agent, or Firm* — STIP Law Group, LLC

(57) ABSTRACT

A piezoelectric element for power generation and a power generation device using the same according to the present invention can maximize an electromotive force generated by the piezoelectric element by converting an external force (a natural force or a load force of a person/vehicle or the like) transferred from the outside into an instantaneous impact force and transferring the impact force to the piezoelectric element.

11 Claims, 9 Drawing Sheets

(56) References Cited

U.S. PATENT DOCUMENTS

| | | | |
|---|---|---|---|
| 8,541,927 B2 * | 9/2013 | Hayamizu | A01K 85/01 310/339 |
| 2007/0200468 A1 * | 8/2007 | Heim | F04B 43/0054 310/311 |
| 2008/0136290 A1 * | 6/2008 | Lee | H02N 2/18 310/319 |
| 2008/0136292 A1 * | 6/2008 | Thiesen | B60C 23/041 310/334 |
| 2015/0187349 A1 * | 7/2015 | Schafer | G10K 9/121 367/189 |
| 2015/0320323 A1 * | 11/2015 | Bakema | A61B 7/00 600/586 |

FOREIGN PATENT DOCUMENTS

| | | | | |
|---|---|---|---|---|
| JP | 4881508 B2 * | 2/2012 | | H02N 2/183 |
| KR | 20060089661 | 8/2006 | | |
| KR | 101132934 | 4/2012 | | |
| KR | 20140039708 | 4/2014 | | |
| WO | WO-2016111601 A1 * | 7/2016 | | H02N 2/18 |

* cited by examiner

[Fig. 1]
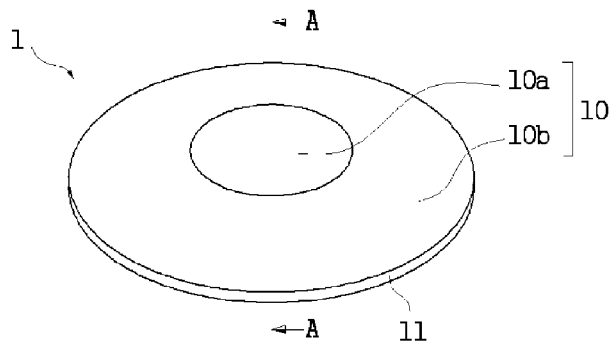
[Fig. 2a]
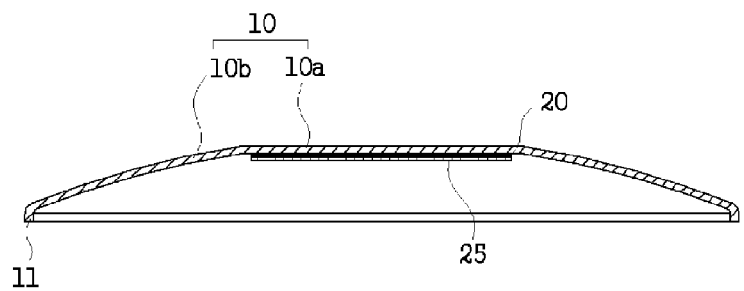
[Fig. 2b]
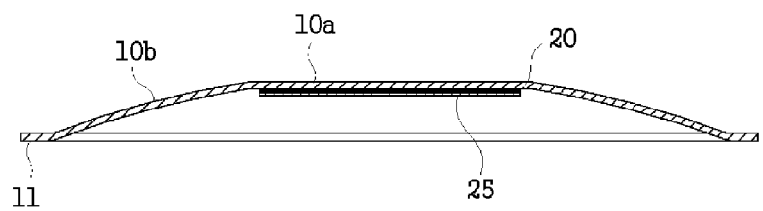
[Fig. 2c]
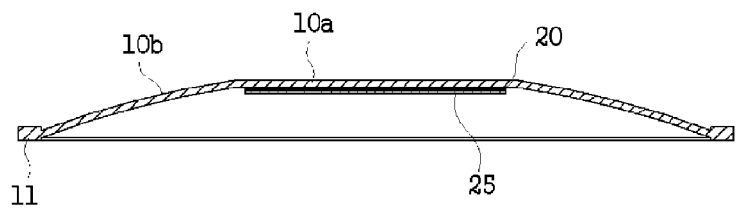
[Fig. 2d]
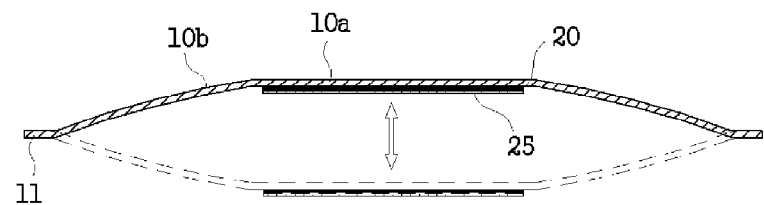

[Fig. 2e]
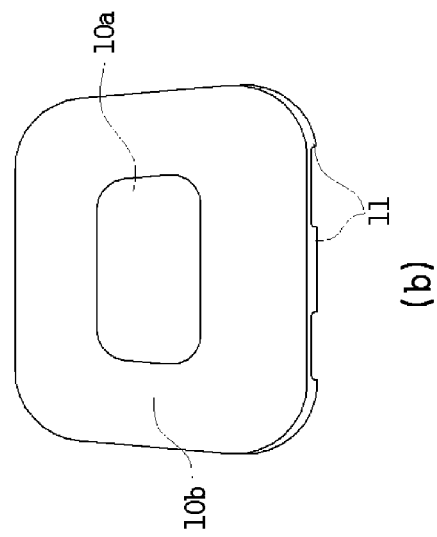
(b)
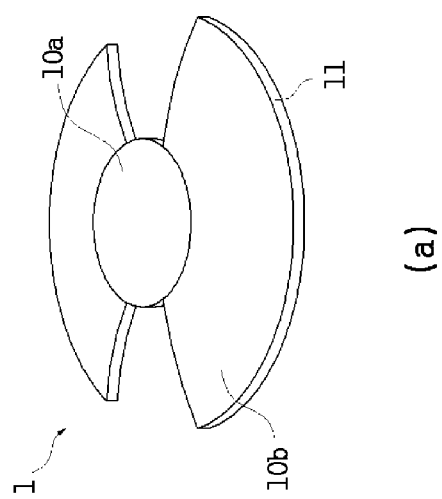
(a)

[Fig. 3]
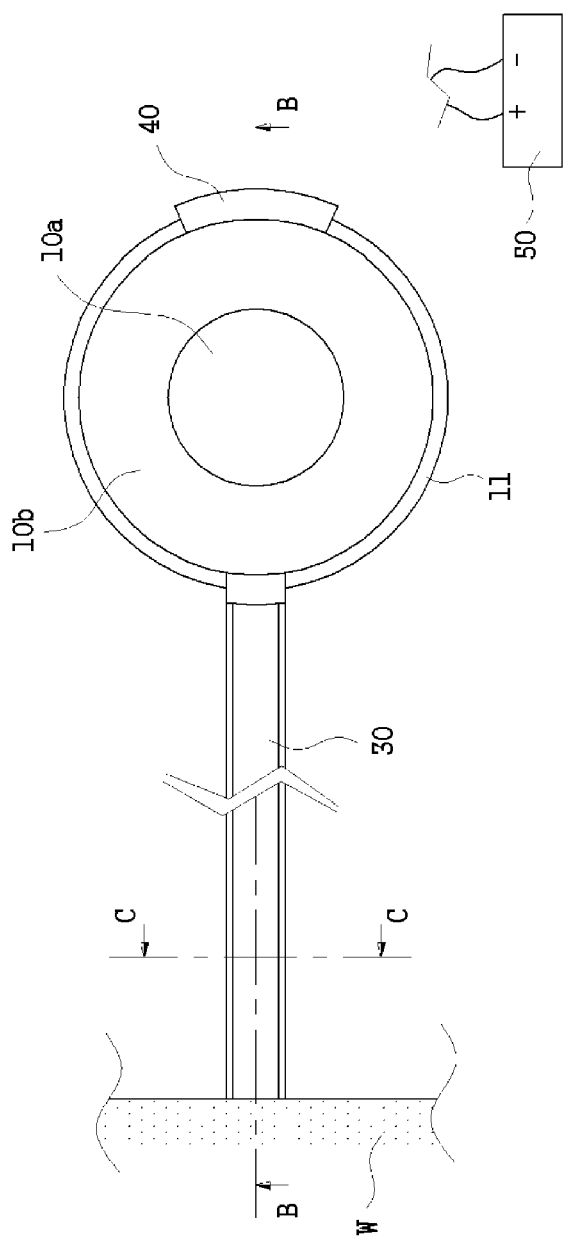

[Fig. 4]
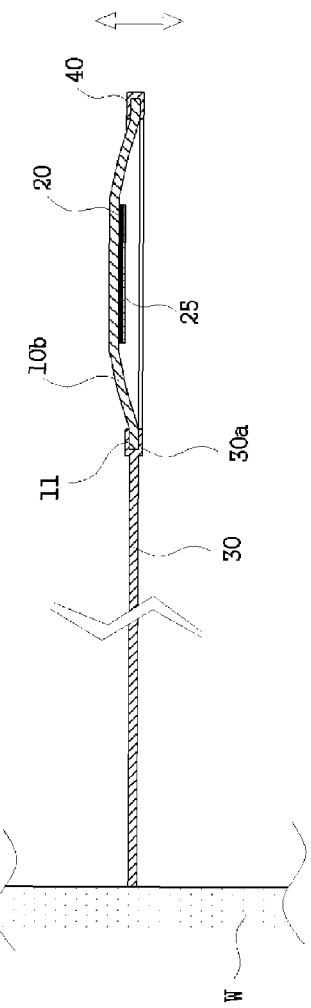
[Fig. 5]
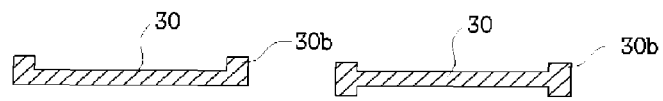
[Fig. 6]
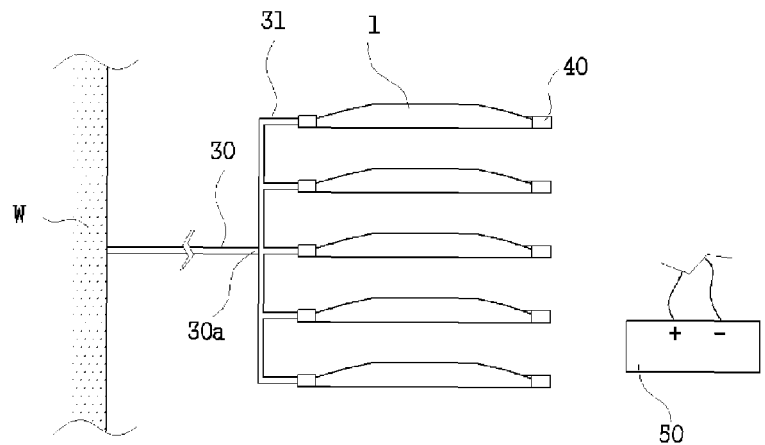

[Fig. 7]
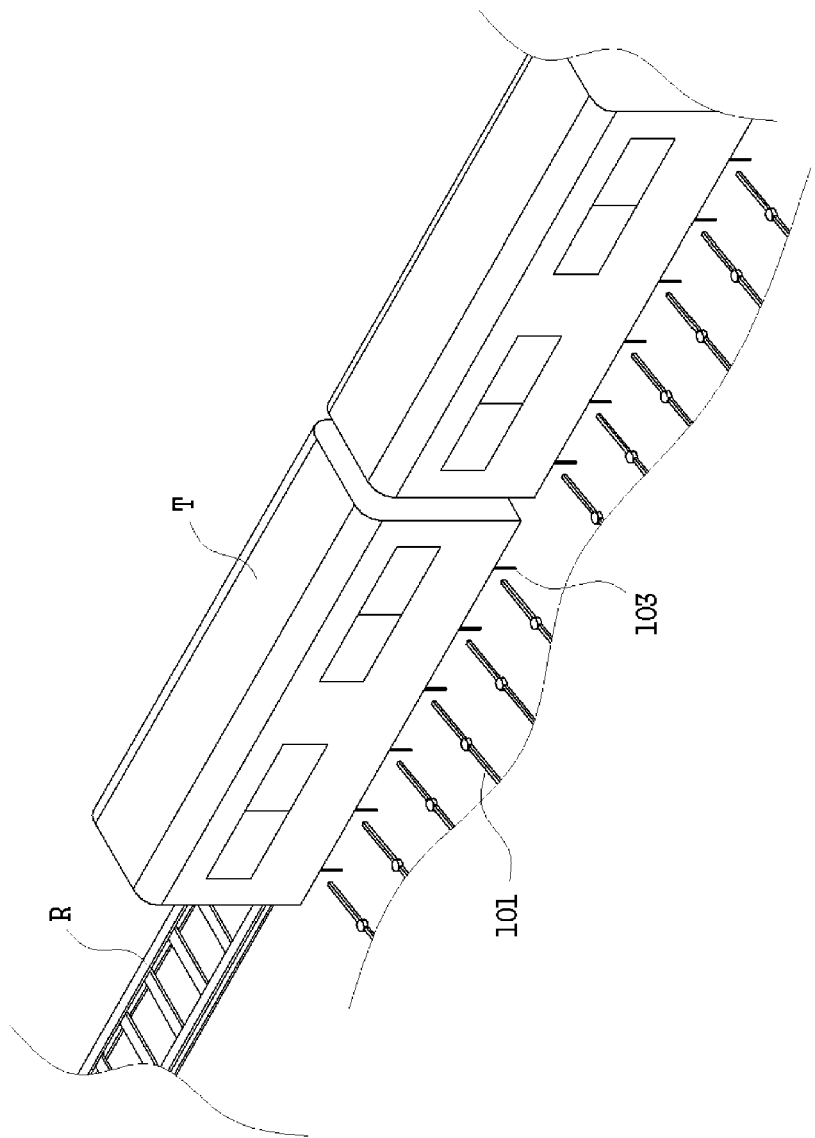

[Fig. 8]
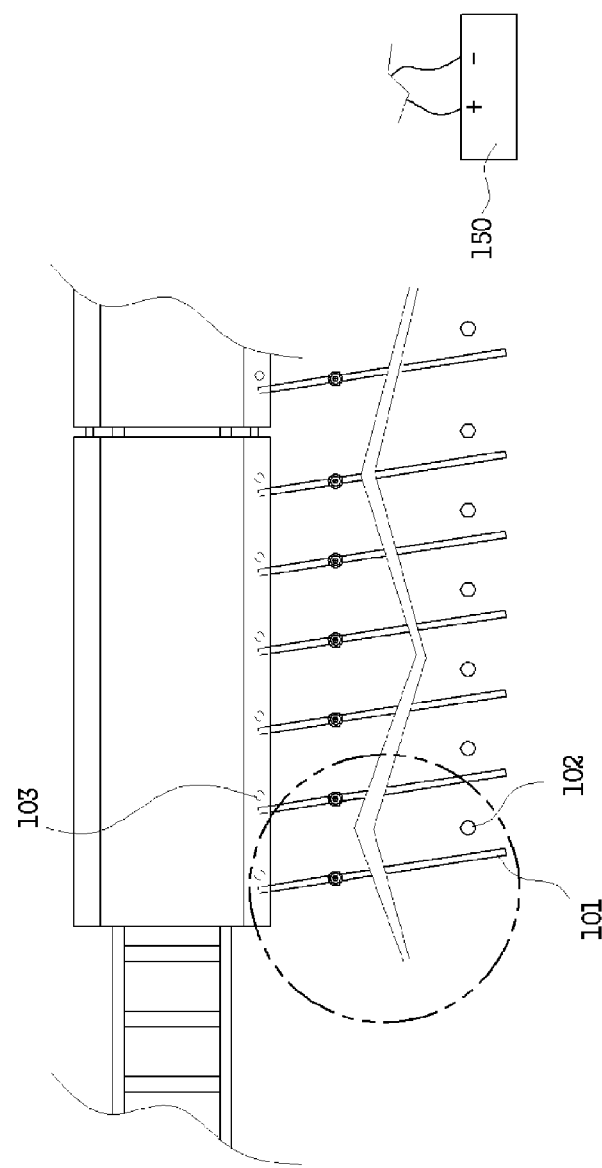
[Fig. 9]
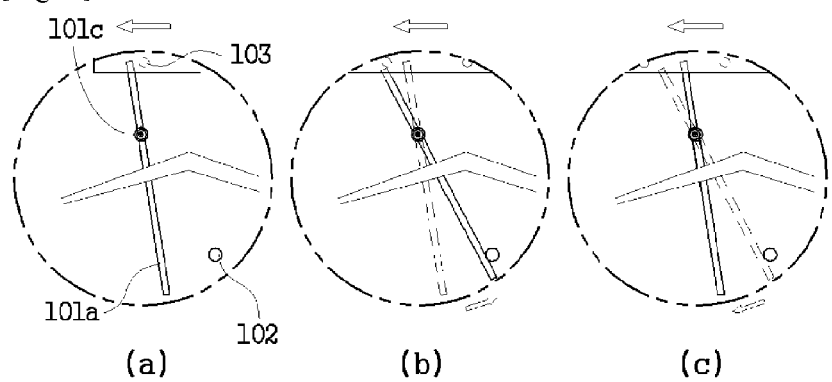

[Fig. 10]
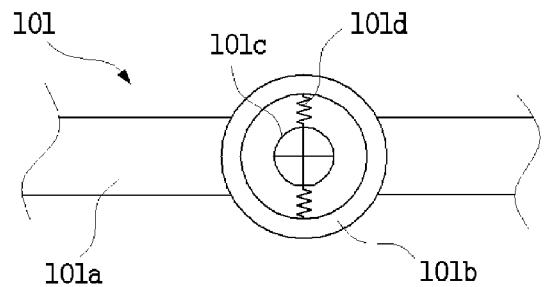
[Fig. 11]
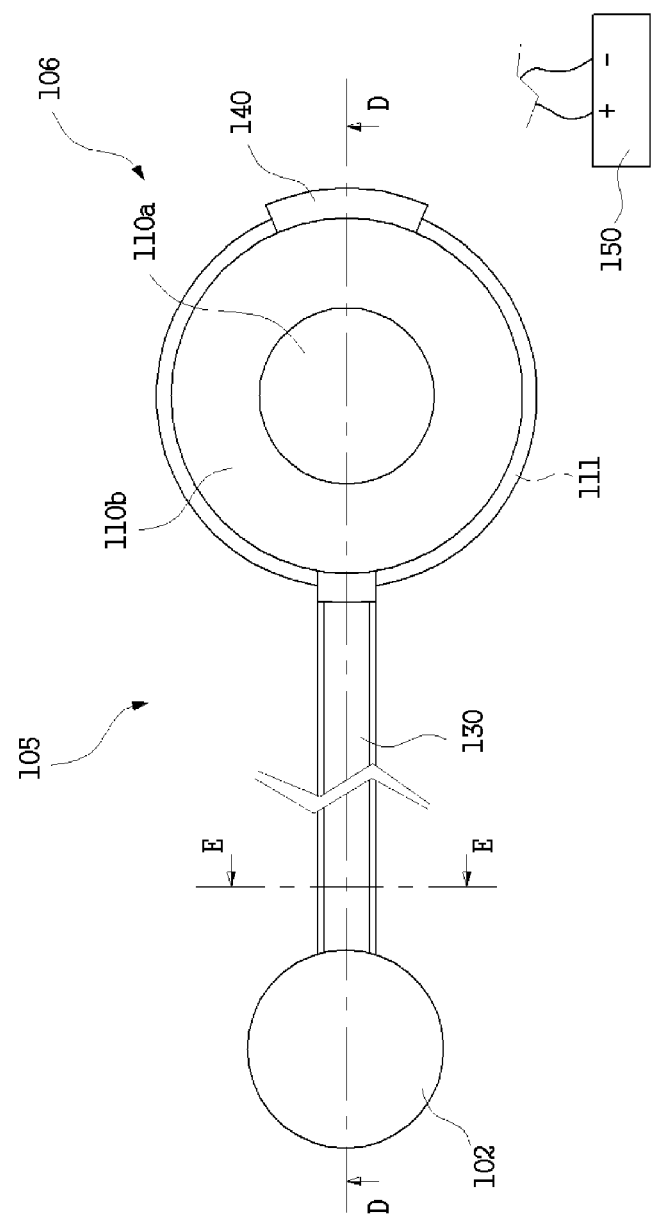

[Fig. 12]
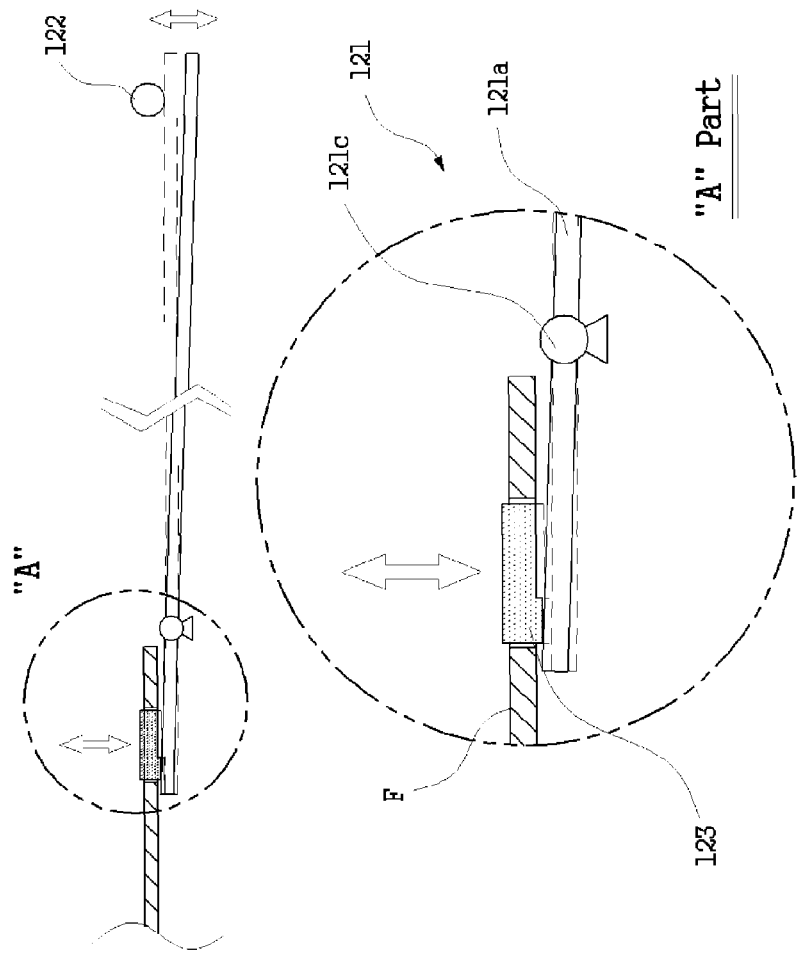
[Fig. 13]
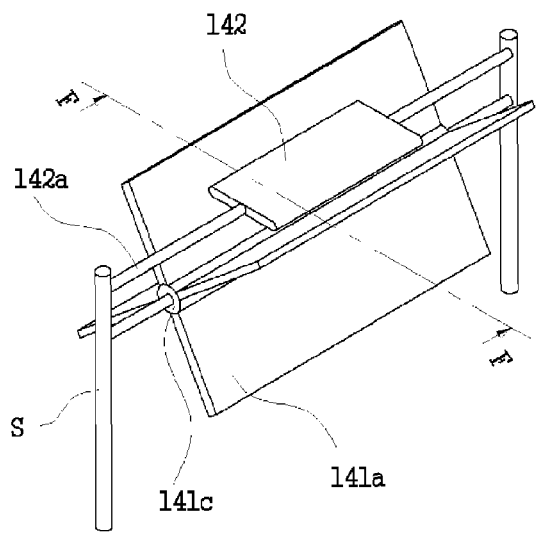

[Fig. 14]
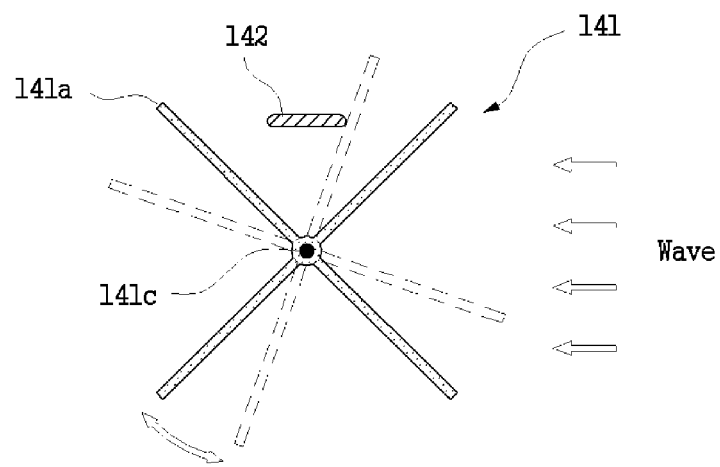
[Fig. 15]
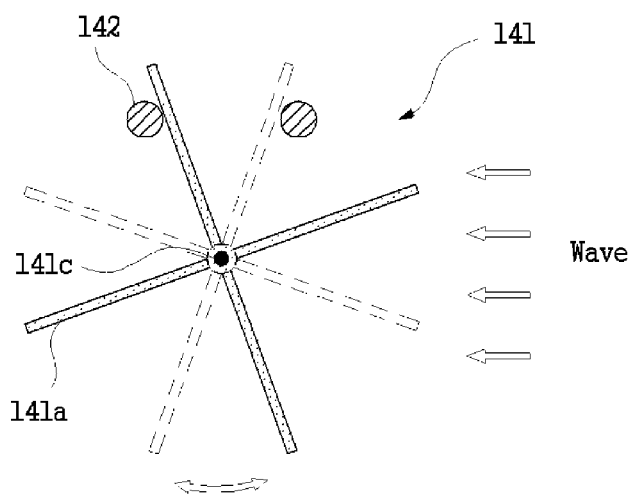

ular and although the piezoelectric element is used in an oscillator, a speaker or the like in the prior art, a lot of attempts have been made recently to use the piezoelectric element to generate power as a kind of new and renewable energy.
PIEZOELECTRIC ELEMENT FOR POWER GENERATION AND POWER GENERATION DEVICE USING SAME

BACKGROUND

The present invention relates to a piezoelectric element for power generation and a power generation device using the same, and more specifically, to a piezoelectric element for power generation and a power generation device using the same, which can maximize an electromotive force generated by the piezoelectric element by converting an external force (a natural force, a load force of a person/vehicle or the like) transferred from outside into an instantaneous impact force and transferring the impact force to the piezoelectric element.

Generally, a piezoelectric element is a device having a property of generating an electromotive force using a potential difference generated by electrical polarization when a mechanical pressure is applied from outside and, contrarily, generating deformation or stress when a voltage is applied, and although the piezoelectric element is used in an oscillator, a speaker or the like in the prior art, a lot of attempts have been made recently to use the piezoelectric element to generate power as a kind of new and renewable energy.

A power generation device using a piezoelectric element according to a conventional technique chiefly uses a method of generating electricity by directly pressing or deforming the piezoelectric element using an external force such as a load of a person or a vehicle, and details thereof are specifically disclosed in the [Document 1] and the like described below.

However, the piezoelectric element for power generation according to the conventional technique has a problem in that since an external force is applied for a relatively long period of time as much as several tens or hundreds of milliseconds, a generated voltage is extremely low due to the characteristic of a piezoelectric material, in which magnitude of an electromotive force generated when an external force of the same magnitude is applied is inverse proportional to the time of applying the external force, and thus it is difficult to accomplish commercialization of the piezoelectric element with economic feasibility.

In order to solve such a problem of the conventional technique, a piezoelectric element for generating power using an elastic impact force of a very high frequency, which is generated when a metal thin film is elastically deformed by an external force, has been developed recently as shown in the [Document 2] applied by the inventors of the present invention However, since even the piezoelectric element disclosed in the [Document 2] described below uses a method of fixing a piezoelectric ceramic on a curved deformation surface of a metal thin film which repeats elastic deformation and restoration by an external force, there is a problem in that the curved surface of the metal thin film is not tightly attached to the piezoelectric ceramic when the piezoelectric element is manufactured.

Furthermore, in the case of the piezoelectric element disclosed in the [Document 2] described below, since the curved surface on which the piezoelectric ceramic is fixed is configured to directly generate elastic deformation by an external force, a strong elastic impact force generated by deformation of the curved surface is directly transferred to the piezoelectric ceramic, and thus there is a problem in that the piezoelectric ceramic is damaged and does not maintain a function as a piezoelectric element.

[Document 1] Korean Patent Registration No. 988077 (Disclosed on Oct. 18, 2010)
[Document 2] Korean Patent Registration No. 1132934 (Disclosed on Mar. 27, 2012)

SUMMARY OF THE INVENTION

Therefore, the present invention has been made in view of the above problems, and it is an object of the present invention to provide a piezoelectric element for power generation and a power generation device using the same, which can generate electricity using an elastic impact force generated when a metal thin film approximately configured in a convex or concave shape is elastically deformed in the vertical direction by an external force.

Another object of the present invention is to provide a piezoelectric element for power generation and a power generation device using the same, which can solve the problem of damaging the piezoelectric material by deformation of a metal thin film, by configuring the shape of the metal thin film not to generate deformation in a portion where the piezoelectric material is fixed when the metal thin film approximately configured in a convex or concave shape is elastically deformed in the vertical direction by an external force.

In addition, still another object of the present invention is to provide a power generation device using a piezoelectric element, which can maximize the electromotive force generated by the piezoelectric element by configuring the power generation device to convert an external force, such as a natural force or a load of a person/vehicle, into an instantaneous impact force of a very high frequency having a very short application time and transfer the impact force to the piezoelectric element.

To accomplish the above objects, according to one aspect of the present invention, there is provided a piezoelectric element for power generation, the piezoelectric element including: a metal thin film; a piezoelectric material layer fixed to at least any one of a top surface and a bottom surface of the metal thin film; and an electrode layer formed at one side of an outer surface of the piezoelectric material layer, in which the metal thin film is configured of a flat surface unit to which the piezoelectric material layer is fixed, and an elastic deformation unit configured in a shape extended and bent from a rim of the flat surface unit toward outside to be elastically deformed in the vertical direction of the flat surface unit and generate an impact force when an external force is applied.

In addition, the piezoelectric element further includes a reinforcement unit formed at an outer end portion of the elastic deformation unit in order to prevent, when the elastic deformation unit is deformed, the flat surface unit from being deformed in accordance with the deformation.

In addition, the reinforcement unit is configured by bending the outer end portion of the elastic deformation unit.

In addition, the reinforcement unit is configured by forming the outer end portion of the elastic deformation unit to be thicker than the other portions.

According to another aspect of the present invention, there is provided a power generation device using a piezoelectric element, the power generation device including: the piezoelectric element described above; a connection member of a bar shape, in which one end portion of a length direction is connected to the piezoelectric element; a supporting body for fixing the other end portion of the length direction so that the connection member may be formed in a shape of a cantilever; and a charging unit electrically connected to the piezoelectric element to charge electricity generated by the piezoelectric element.

In addition, the cross section of the connection member is a panel shape, and a strength reinforcement unit bent or thicker than a center portion is formed at both end portions of a width direction in order to reinforce strength.

In addition, the power generation device further includes a weight formed at one end portion of the piezoelectric element to support deformation of at least any one of the metal thin film and the connection member when an external force is applied.

In addition, a branch member for branching a plurality of piezoelectric elements in a stacked form to be spaced apart from each other and connecting the piezoelectric elements to the connection members is further formed at one end portion of the connection member to which the piezoelectric element is connected.

In addition, a power generation device using a piezoelectric element according to the present invention includes: an external force transfer unit for generating a displacement when an external force is applied; a stopper unit installed at one side of the external force transfer unit to generate an impact force by collision with the external force transfer unit where the displacement is generated; a piezoelectric power generation unit installed at least at any one of the external force transfer unit and the stopper unit to generate electricity using a piezoelectric effect obtained by the impact force; and a charging unit for charging the electricity generated by the piezoelectric power generation unit.

In addition, the external force transfer unit includes a rotation axis and a rotation member of a bar shape having a middle one end portion combined with the rotation axis so that both end portions may rotate centering on the rotation axis, and the stopper unit is installed to collide with the other end portion of the rotation member when one end portion of the rotation member rotates by an external force.

In addition, the external force is a kinetic energy of a traveling train, and a kinetic energy transfer member for transferring the kinetic energy at a time of traveling to one end portion of the rotation member is installed at one side of the train.

In addition, the external force is a load energy of a vehicle traveling on a ground surface, and a load energy transfer member for transferring the load energy transferred through a wheel of the vehicle to one end portion of the rotation member is installed on the road surface.

In addition, the external force transfer unit is formed in a waterwheel shape including a rotation axis and a plurality of blades arranged in a radial shape centering on the rotation axis, and at least some of stopper units are installed between the blades so that the stopper units may collide with the blades when the blades rotate centering on the rotation axis by a wave force, which is an external force.

In addition, the piezoelectric power generation unit is configured to include a piezoelectric element and a connection member for transferring the impact force to the piezoelectric element, in which one end portion of the connection member is connected to the piezoelectric element and the other end portion is connected to the external force transfer unit or the stopper unit, in which the piezoelectric element includes: a metal thin film; a piezoelectric material layer fixed to at least any one of a top surface and a bottom surface of the metal thin film; and an electrode layer formed at one side of an outer surface of the piezoelectric material layer.

As described above, the piezoelectric element for power generation according to the present invention and the power generation device using the same can maximize an electromotive force generated by the piezoelectric element by converting an external force (a natural force, a load force of a person/vehicle or the like) transferred from outside into an instantaneous impact force and transferring the impact force to the piezoelectric element.

In addition, the piezoelectric element for power generation according to the present invention and the power generation device using the same can further maximize an electromotive force generated by the piezoelectric element by generating an additional impact force using elastic deformation of a metal thin film when an impact force generated by an external force is applied as described above, by configuring the shape of the metal thin film configuring the piezoelectric element in an approximate convex or concave shape which can be elastically deformed in the vertical direction.

In addition, the piezoelectric element for power generation according to the present invention and the power generation device using the same can prevent a piezoelectric material from being damaged by deformation of a metal thin film, by configuring a portion of the metal thin film to which a piezoelectric material is fixed in a shape of a flat surface and configuring a reinforcement unit at the rim of the thin film so that deformation may not generate in the portion to which a piezoelectric material is fixed even when the metal thin film repeats elastic deformation and restoration in the vertical direction by an external force.

BRIEF DESCRIPTION OF THE DRAWINGS

FIG. 1 is a view showing the configuration of a piezoelectric element for power generation according to a first embodiment of the present invention.

FIGS. 2a to 2c are exploded cross-sectional views taken along the line A-A in FIG. 1.

FIG. 2d is an exploded cross-sectional view taken along the line A-A to illustrate the operation of the piezoelectric element shown in FIG. 1 when an external force is applied.

FIG. 2e is a view showing another modified example of the piezoelectric element for power generation according to a first embodiment of the present invention.

FIG. 3 is a view illustrating the configuration of a power generation device using a piezoelectric element according to a second embodiment of the present invention.

FIG. 4 is an exploded cross-sectional view taken along the line B-B in FIG. 3.

FIG. 5 is an exploded cross-sectional view taken along the line C-C in FIG. 3.

FIG. 6 is a view showing another modified example of a power generation device using a piezoelectric element according to a second embodiment of the present invention.

FIG. 7 is a perspective view showing the configuration of a power generation device using a piezoelectric element according to a third embodiment of the present invention.

FIG. 8 is a plan view showing the configuration of the power generation device shown in FIG. 7.

FIG. 9 is a view illustrating the operation of the external force transfer unit and the stopper unit shown in FIG. 8.

FIG. 10 is an exploded view illustrating the detailed configuration of the rotation axis shown in FIG. 9.

FIG. 11 is a view showing the configuration of a piezoelectric power generation unit according to a third embodiment of the present invention.

FIG. 12 is a perspective view showing the configuration of a power generation device using a piezoelectric element according to a fourth embodiment of the present invention.

FIG. 13 is a perspective view showing the configuration of a power generation device using a piezoelectric element according to a fifth embodiment of the present invention.

FIGS. 14 and 15 are exploded cross-sectional views taken along the line F-F to illustrate the operation of the external force transfer unit and the stopper unit shown in FIG. 13.

DETAILED DESCRIPTION OF THE INVENTION

The preferred embodiments of the present invention will be hereafter described in detail, with reference to the accompanying drawings.

(First Embodiment): Piezoelectric Element for Power Generation

FIG. 1 is a view showing the configuration of a piezoelectric element for power generation according to a first embodiment of the present invention, and FIGS. 2a to 2c are exploded cross-sectional views taken along the line A-A in FIG. 1.

In addition, FIG. 2d is an exploded cross-sectional view taken along the line A-A to illustrate the operation of the piezoelectric element shown in FIG. 1 when an external force is applied, and FIG. 2e is a view showing another modified example of the piezoelectric element for power generation according to a first embodiment of the present invention.

A piezoelectric element for power generation according to this embodiment is configured to include a metal thin film 10, a piezoelectric material layer 20 fixed to at least any one of the top surface and the bottom surface of the metal thin film 10, and an electrode layer 25 formed at one side of an outer surface of the piezoelectric material layer 20.

At this point, the metal thin film 10 is configured of a flat surface unit 10a to which the piezoelectric material layer 20 is fixed, and an elastic deformation unit 10b configured in a shape extended and bent from the rim of the flat surface unit 10a toward outside to be elastically deformed in the vertical direction of the flat surface unit 10a and generate an impact force when an external force is applied.

Owing to the configuration described above, the metal thin film 10 according to the present invention is configured in a shape of bending the elastic deformation unit 10b toward the outer lower direction (approximately, a convex shape) or toward the outer upper direction (approximately, a concave shape) from the flat surface unit 10a.

Although a case of configuring the metal thin film 10 in a shape of a dome having the flat surface unit 10a formed at the top center is described in this embodiment as an example, it is not limited thereto, and the metal thin film 10 may be configured in a convex or concave shape of a rectangular, polygonal or oval shape as shown in FIG. 2e(b) as needed.

In addition, although a case of positioning the flat surface unit 10a at the center of the metal thin film 10 is described in this embodiment as an example, it is not limited thereto, and the flat surface unit 10a may be formed to be eccentric in any one direction in the entire shape of the metal thin film 10 as needed.

In addition, although a case of forming the elastic deformation unit 10b as a curved surface configuring a dome shape is described in this embodiment as an example, it is not limited thereto, and it is apparent that the elastic deformation unit 10b may be formed as an inclined surface as needed.

In addition, although a case of forming the elastic deformation unit 10b to be extended from the entire rim of the flat surface unit 10a is described in this embodiment as an example, it is not limited thereto, and the elastic deformation unit 10b may be formed to be extended from at least a portion of the rim of the flat surface unit 10a as shown in FIG. 2e(a) as needed.

Accordingly, the expression of "extending from the rim of the flat surface unit toward outside" in the BEST MODE FOR CARRYING OUT THE INVENTION and the CLAIMS of this application is a concept including a case of extending from at least a portion of the rim of the flat surface unit 10a as shown in FIG. 2e(a), as well as a case of extending from the entire rim of the flat surface unit 10a.

At this point, although any metal which can be elastically deformed and restored by an external force and has electrical conductivity as described below can be used as the metal thin film 10 without a problem, it is preferable to use brass which is an alloy of zinc and copper, phosphor bronze which is an alloy of phosphorus, tin and copper or like, and phosphor bronze 5210 having superior elasticity and electrical conductivity among them is used in this embodiment as an example.

In addition, the piezoelectric material layer 20 may be preferably configured using at least any one of publicly known piezoelectric ceramic materials or piezoelectric film materials (PVDF) provided with a piezoelectric effect, such as $Pb(Zr, Ti)O_3$, and the piezoelectric material layer 20 may be firmly fixed to the flat surface unit 10a of the metal thin film 10 using a conductive epoxy.

In addition, the electrode layer 25 is a constitutional element for forming an electrode together with the metal thin film 10, and although it may be configured using a variety of materials having conductivity, the electrode layer 25 is configured in a method of plating (or thin film coating) one side of the outer surface of the piezoelectric material layer 20 (i.e., an opposite side electrically spaced apart from the surface on which the metal thin film is fixed or a side surface thereof) by using gold or silver in this embodiment as an example.

The piezoelectric element 1 according to the present invention configured as described above is advantageous in that since the piezoelectric material layer 20 is configured to be fixed to the flat surface unit 10a formed on the metal thin film 10, the piezoelectric material layer 20 can be easily and tightly attached to the metal thin film 10 in the manufacturing process, and thus the error rate of tightly attaching the piezoelectric material layer 20 and the metal thin film 10 can be remarkably reduced compared with a case of fixing the piezoelectric material layer 20 on the curved surface of the metal thin film 10 like in the conventional technique.

Meanwhile, since the elastic deformation unit 10b of a shape bent toward outside of the flat surface unit 10a is a structure possessing elasticity like a spring in the shape itself, when an external force is applied in a direction perpendicular to the flat surface unit 10a, elastic deformation of momentarily inverting to a direction opposite to a bent direction and restoring to the original position by the elasticity of its own (i.e., vertical deformation of the flat surface unit) is accomplished as shown in FIG. 2d.

In this case, since the elastic deformation unit 10b generates an instantaneous elastic impact force and the impact force of a very high frequency generated like this (i.e., instantaneous pressing force) is transferred to the piezoelectric material layer 20 through the flat surface unit 10a, the piezoelectric element 1 according to the present invention generates a remarkably high electromotive force even when the same external force is applied, compared with a conventional technique of transferring the external force to the piezoelectric material layer 20 in the form of a pressing force applied for a long period of time of a several tens or hundreds of milliseconds level.

This is based on the characteristic of a piezoelectric material, in which a generated electromotive force is inverse proportional to the time of applying an external force as described above even when the same external force is applied, and the present invention uses such a power generation characteristic of the piezoelectric material.

In addition, since magnitude of the instantaneous impact force generated like this is much larger than that of a case in which the external force is directly transferred to the piezoelectric material like in a conventional technique, an effect of further increasing the electromotive force generated by the piezoelectric material can be obtained.

In addition, since a portion to which the piezoelectric material layer 20 is fixed (i.e., the flat surface unit) is configured in a flat surface shape to be prevented from being deformed in connection with the deformation of the elastic deformation unit 10b when the elastic deformation unit 10b is elastically deformed like this, the flat surface unit 10a performs vertical movements while maintaining its own shape as shown in FIG. 2d even when the elastic deformation unit 10b is deformed by an external force, and thus the piezoelectric material layer 20 is prevented from being damaged.

Furthermore, the flat surface unit 10a is a portion relatively thicker than the elastic deformation unit 10b owing to the fixation of the piezoelectric material layer 20, and thus it is advantageous in that since the flat surface unit 10a performs vertical movements while maintaining its own shape even when the elastic deformation unit 10b is deformed by an external force as described above, the piezoelectric material layer 20 is further prevented from being damaged, and, to this end, the metal thin film 10 may be formed to have the flat surface unit 10a thicker than the elastic deformation unit 10b as needed.

Meanwhile, the piezoelectric element 1 according to this embodiment may further include a reinforcement unit 11 formed at the outer end portion of the elastic deformation unit 10b as shown in FIGS. 2a to 2c in order to further prevent deformation of the flat surface unit 10a.

In this case, even when the elastic deformation unit 10b is vertically inverted and/or restored, the reinforcement unit 11 performs a function of preventing deformation of the flat surface unit 10a in response thereto, by preventing deformation of the entire flat surface unit 10a by an external force.

Describing an exemplary configuration for this function, FIGS. 2a and 2b are respectively an example of forming the reinforcement unit 11 by bending the outer end portion of the elastic deformation unit 10b at a predetermined angle with respect to the elastic deformation unit 10b, and FIG. 2c is an example of forming the reinforcement unit 11 by forming the outer end portion of the elastic deformation unit 10b to be relatively thicker than the other portions (i.e., the other portions of the elastic deformation unit) like a rim.

Meanwhile, the configurations of the reinforcement units 11 shown in FIGS. 2a to 2c are merely examples, and the reinforcement unit 11 may be configured in a variety of different shapes as far as performing the same function.

In addition, although a case of forming the reinforcement unit 11 throughout the entire outer end portion of the elastic deformation unit 10b is described in this embodiment as an example, it is not limited thereto, and it is apparent that the reinforcement unit 11 may be partially formed at some of the outer end portion of the elastic deformation unit 10b as shown in FIG. 2e(b) as far as performing the same function.

Accordingly, the expression of "bending the outer end portion of the elastic deformation unit" and the expression of "forming the outer end portion of the elastic deformation unit to be thicker than the other portions" in the part describing the configuration of the reinforcement unit in the BEST MODE FOR CARRYING OUT THE INVENTION and the CLAIMS of this application are a concept including a case of bending some of the outer end portion of the elastic deformation unit 10b and manufacturing some of the outer end portion to be thick, as well as a case of bending the entire outer end portion of the elastic deformation unit 10b and manufacturing the outer end portion to be thick.

(Second Embodiment): Power Generation Device Using Piezoelectric Element

FIG. 3 is a view illustrating the configuration of a power generation device using a piezoelectric element according to a second embodiment of the present invention, FIGS. 4 and 5 are exploded cross-sectional views taken along the lines B-B and C-C in FIG. 3, and FIG. 6 is a view showing another modified example of a power generation device using a piezoelectric element according to a second embodiment of the present invention.

A piezoelectric element used in a power generation device using a piezoelectric element according to this embodiment uses at least any one of the piezoelectric elements 1 for power generation described in the first embodiment, and the same reference numerals are assigned to the configurations the same as those of the first embodiment among the configurations related to the piezoelectric element, and overlapped descriptions will be omitted.

A power generation device using a piezoelectric element according to this embodiment is configured to include at least any one of piezoelectric elements 1 among the power generation elements (→piezoelectric elements) described in the first embodiment, a connection member 30 of a bar shape for connecting one end portion 30a of the length direction to the piezoelectric element 1, a supporting body W for fixing the other end portion of the length direction so that the connection member 30 may be formed in a shape of a cantilever, and a charging unit 50 electrically connected to the piezoelectric element 1 to charge electricity generated by the piezoelectric element 1.

At this point, it is preferable that the connection member 30 is configured as a long rod shape having a cross section of a circular or polygonal shape in the width direction so as to induce elastic deformation of the piezoelectric element 1 for power generation by vibrating in the form of vibration of a cantilever in a direction to which an external force is applied, and the connection member 30 is configured as a bar having a cross section of a panel shape in this embodiment as an example.

In addition, the connection member 30 is preferably configured using a metal material, an alloy material, a plastic material (a reinforced plastic material or the like) or the like having superior durability and elasticity as far as performing the function described above and is further preferably configured such that the direction of vibration generated in response to an external force corresponds to the direction of the elastic deformation unit 10b of the piezoelectric element 1 vertically deformed by the external force.

In addition, a strength reinforcement unit 30b bent upward or downward or formed to be thicker than the center portion may be further provided at both end portions of the connection member 30 in the width direction to prevent the connection member from being damaged when the connection member 30 vibrates by an external force.

Although a case of forming the strength reinforcement unit 30b throughout the entire connection member 30 in the length direction is described in this embodiment as an example, it is not limited thereto, and the strength reinforcement unit 30b may be configured to be formed only in a portion (for example, a portion where loads are concentrated when the connection member vibrates) as needed.

Accordingly, the expression of "at both end portions in the width direction" in the part describing the configuration of the strength reinforcement unit in the BEST MODE FOR CARRYING OUT THE INVENTION and the CLAIMS of this application is a concept including both end portions of a portion of the length direction, as well as both end portions throughout the entire connection member 30 in the length direction.

In addition, one end portion 30a of the connection member 30 in the length direction is connected to the outer end portion (i.e., the reinforcement unit) of the piezoelectric element 1, and, in this case, a weight 40 for supporting deformation of at least any one of the metal thin film 10 and the connection member 30 when an external force is applied may be further included at one end portion of the piezoelectric element (preferably, an end portion opposite to the portion connected to the connection member).

In this case, when the connection member 30 and/or the metal thin film 10 is deformed by an external force, the weight 40 performs a function of supporting deformation of at least any one of the metal thin film 10 and the connection member 30 by further adding an inertial force generated by addition of mass.

Meanwhile, although the supporting body W may be configured as a fixed supporting body which is not deformed by an external force like a wall surface, the supporting body W may be configured as a mobile supporting body deformed by an external force as needed so as to generate a motion relative to the connection member 30 and/or the metal thin film 10 when an external force is applied.

In addition, the charging unit 50 is a device for charging electricity generated by elastic deformation of the connection member 30 and/or the metal thin film 10 described above, and the charging unit 50 may be electrically connected to the piezoelectric element (specifically, the electrode layer and the metal thin film) through a wire, which is not shown.

In this case, since the configuration related to connection of the wire to the piezoelectric element 1 and the charging unit 50 using thereof are publicly known techniques and unrelated to the spirit of the present invention, detailed descriptions thereof will be omitted.

Owing to the configuration described above, the power generation device using a piezoelectric element 1 according to the present invention is advantageous in that even when the same external force is applied, the amount of generated power increases remarkably compared with the power generation device according to the conventional technique which generates power by simply pressing the piezoelectric element using an external force.

Meanwhile, although a case of connecting one piezoelectric element to one end portion 30a of the connection member 30 is described in this embodiment as an example, it is not limited thereto, and it may be configured to connect a plurality of piezoelectric elements 1 to one end portion 30a of the connection member 30 as shown in FIG. 6 as needed.

However, in this case, a branch member 31 for branching the plurality of piezoelectric elements 1 in a stacked form to be spaced apart from each other by a predetermined distance and connecting the plurality of piezoelectric elements 1 to the connection members 30 is further formed at one end portion 30a of the connection member 30, and it is preferable that the distance spaced between the piezoelectric elements 1 is set so as not to interfere elastic deformation of the metal thin films 10 with each other.

(Third Embodiment): Power Generation Device Using Kinetic Energy of Train

FIG. 7 is a perspective view showing the configuration of a power generation device using a piezoelectric element according to a third embodiment of the present invention, FIG. 8 is a plan view showing the configuration of the power generation device shown in FIG. 7, and FIG. 9 is a view illustrating the operation of the external force transfer unit and the stopper unit shown in FIG. 8.

In addition, FIG. 10 is an exploded view illustrating the detailed configuration of the rotation axis shown in FIG. 9, and FIG. 11 is a view showing the configuration of a piezoelectric power generation unit according to a third embodiment of the present invention.

A power generation device using a piezoelectric element according to this embodiment is configured to include an external force transfer unit 101 for generating a displacement when an external force is applied, a stopper unit 102 installed at one side of the external force transfer unit 101 to generate an impact force by collision with the external force transfer unit 101 where the displacement is generated, a piezoelectric power generation unit 105 for generating electricity using a piezoelectric effect obtained by the impact force, and a charging unit 150 for charging the electricity generated by the piezoelectric power generation unit 105.

At this point, the external force transfer unit 101 includes a rotation axis 101c and a rotation member 101a of a bar shape having a middle one end portion 101b combined with the rotation axis 101c so that both end portions may rotate centering on the rotation axis 101c.

In addition, an elastic member 101d for restoring the rotation member 101a rotated by an external force to an original position as described below may be further installed between the rotation axis 101c and the middle one end portion 101b of the rotation member 101a combined with the rotation axis 101c.

In addition, the stopper unit 102 is installed to collide with the other end portion of the rotation member 101a when one end portion of the rotation member 101a rotates by an external force, and the external force transfer unit 101 and the stopper unit 102 may be configured of a metal material, wood, a synthetic resin material such as a reinforced plastic or the like as needed.

In addition, the external force in this embodiment is configured of kinetic energy of a train T traveling on a railroad R (a concept including all transportation means of a type traveling on a railroad such as a subway train, a narrow-gauge train, an amusement park train, a transport carriage of a mine and the like).

Accordingly, to this end, it is preferable that a kinetic energy transfer member 103 for transferring the kinetic energy at the time of traveling to one end portion of the rotation member 101a is installed at one side of the train T, and although the kinetic energy transfer member 103 is configured at one side of the bottom surface of the train T in this embodiment as an example, it is not limited thereto, and the kinetic energy transfer member 103 may be installed on the side surface of the train as far as performing the same function.

In addition, it is preferable that the kinetic energy transfer member 103 is installed in plurality to be spaced apart from each other by a predetermined distance, and its shape is preferably configured in a form capable of rotating the rotation member 101*a* (for example, a stick or beam shape) by pressing one end portion of the rotation member 101*a* as described below.

In addition, it is further preferable that the kinetic energy transfer member 103 is configured of an elastic material or a flexible material which can be elastically deformed at the moment of collision with the rotation member 101*a* in order to prevent damage or the like when the kinetic energy transfer member 103 collides with the kinetic energy transfer member 103.

In addition, the external force transfer unit 101 and the stopper unit 102 can be respectively installed in plurality to be spaced apart from each other by a distance corresponding to the installation space of the kinetic energy transfer member 103, and it is preferable that the external force transfer unit 101 is installed to be slightly slanted from the traveling direction of the train T for ease of rotation.

Describing the specific operation of the external force transfer unit 101 and the stopper unit 102 configured like this, if the kinetic energy transfer member 103 presses one end portion of the rotation unit 101*a* by traveling of the train T as shown in FIGS. 9(*a*) and (*b*), both end portions of the rotation member 101*a* rotate counterclockwise centering on the rotation axis 101*c*.

An instantaneous impact force of a very high frequency is generated as the other end portion of the rotation member 101*a* rotating like this collides with the stopper unit 102, and, to this end, it is preferable that the stopper unit 102 is fixedly installed at one side of the rotation member 101*a*.

Although the stopper unit 102 is configured in the shape of a pillar in this embodiment as an example, it is not limited thereto, and it is apparent that the stopper unit 102 may be configured in a variety of shapes as far as performing the same function.

Meanwhile, the rotation member 101*a* collided with the stopper unit 102 by the rotation as described above restores to its original position by rotating clockwise as shown in FIG. 9(*c*) so as to consecutively collide with a kinetic energy transfer member 103 of the next turn.

To this end, although the elastic member 101*d* is installed between the middle one end portion 101*b* and the rotation axis 101*c* of the rotation member 101*a* in this embodiment as an example, it is not limited thereto, and the rotation member 101*a* may be configured to be restored to its original position by a repulsive force generated by collision, a geographical slope of the installation position, a load of its own or the like as far as performing the same function.

Meanwhile, the impact force generated like this is transferred to the piezoelectric power generation unit 105, and generation of power is accomplished by a piezoelectric effect, and, to this end, the piezoelectric power generation unit 105 may be installed in at least any one of the external force transfer unit 101 and the stopper unit 102, and in this embodiment, it is configured to install the piezoelectric power generation unit 105 in the stopper unit 102 as an example.

At this point, the piezoelectric power generation unit 105 is configured to include, for example, a piezoelectric element 106, and a connection member 130 of a bar shape for transferring the impact force to the piezoelectric element 106, in which one end portion 130*a* of the length direction is connected to the piezoelectric element 106 and the other end portion is connected to the stopper unit 102, in a manner similar to the description of the second embodiment.

At this point, the detailed configuration of the piezoelectric power generation unit 105 is the same as that described in the second embodiment, and, in the same way, the cross-sectional views taken along the lines D-D and E-E of the piezoelectric power generation unit 105 are the same as those taken along the lines B-B and C-C in FIG. 3 described in the second embodiment.

Since the power generation device using a piezoelectric element according to the present invention uses a method of converting an external force into an instantaneous impact force of a very high frequency and transferring the impact force to the piezoelectric element owing to the configuration described above, it is advantageous in that even when the same external force is applied, the amount of generated power increases remarkably compared with the power generation device according to the conventional technique which generates power by simply pressing the piezoelectric element using an external force, and this will be the same in the fourth and fifth embodiments described below.

In addition, if the piezoelectric element 106 of this embodiment is configured like the piezoelectric element 1 for power generation described in the first embodiment, an additional elastic impact force is generated by deformation of the piezoelectric element 106 of its own due to the impact force transferred from the stopper unit 102, and thus it is advantageous in that the electromotive force generated by the piezoelectric element can be further increased, and this will be the same in the fourth and fifth embodiments described below.

In addition, although a case of configuring the piezoelectric power generation unit 105 to include the piezoelectric element 106 and the connection member 130 is described in this embodiment as an example, it is not limited thereto, and the piezoelectric power generation unit 105 may be preferably configured by using any one of publicly known configurations (for example, a plate-type piezoelectric element, a piezoelectric film or the like) if the configuration receives the impact force and generates electricity by a piezoelectric effect, and this will be the same in the fourth and fifth embodiments described below.

In addition, although the piezoelectric element 106 is configured to be the same as the piezoelectric element 1 for power generation according to the first embodiment described above in this embodiment as an example, it is not limited thereto, and the piezoelectric element may be configured using a publicly known general piezoelectric element as needed, and this will be the same in the fourth and fifth embodiments described below.

(Fourth Embodiment): Power Generation Device Using Load Energy of Vehicle

FIG. 12 is a perspective view showing the configuration of a power generation device using a piezoelectric element according to a fourth embodiment of the present invention, and the same reference numerals are assigned to the constitutional elements the same as those of the third embodiment described above, and overlapped descriptions will be omitted.

A power generation device using a piezoelectric element according to this embodiment is different from that of the third embodiment described above in that generation of power is accomplished by using load energy of a vehicle traveling on the road.

To this end, in the power generation device using a piezoelectric element according to this embodiment, an external force transfer unit 121 includes a rotation axis 121c and a rotation member 121a of a bar shape having a middle one end portion combined with the rotation axis 121c so that both end portions may rotate centering on the rotation axis 121c.

In addition, an elastic member (not shown) for restoring the rotation member 121a rotated by an external force to an original position as described in the third embodiment may be further installed between the rotation axis 101c and the middle one end portion 121b of the rotation member 121a combined with the rotation axis 121c.

At this point, although it is configured to position at least a portion of the rotation member 121a under the road surface F in this embodiment as an example to easily transfer the load energy of a vehicle transferred through a wheel (not shown) of the vehicle traveling on the road surface F, it is not limited thereto, and it is apparent that this can be accomplished in a variety of different configurations as far as performing the same function.

In addition, a load energy transfer member 123 for transferring the load energy transferred through the wheel of the vehicle to one end portion of the rotation member 121a is installed on the road surface F, and the load energy transfer member 123 moves downward by the load of a travelling vehicle and rotates the rotation member 121a by pressing one end portion of the rotation member 121a.

To this end, it is preferable that the load energy transfer member 123 is configured to protrude an upper portion on the top of the road surface F, and a projection for pressing one end portion of the rotation member 121a may be further formed at one side of the bottom surface as needed.

In addition, although it is not shown in the figure, an elastic member (not shown) for restoring the load energy transfer member 123 pressed downward by the wheel to its original position may be further provided, and, as another example, it may be configured to restore the load energy transfer member 123 to its original position by a process of restoring the rotated rotation member 121a to its original position as described below.

Meanwhile, if the load energy transfer member 123 pressed downward by the wheel as described above presses one end portion of the rotation member 121a, the rotation member 121a rotates centering on the rotation axis 121c, and, in this process, an instantaneous impact force of a very high frequency is generated as the other end portion of the rotation member 121a collides with the stopper unit 122 positioned above the rotation member.

In addition, since the configuration of the stopper unit 122 and the other configurations related to generation of power by using the impact force are the same as those of the third embodiment, overlapped descriptions will be omitted below.

(Fifth Embodiment): Power Generation Device Using Kinetic Energy (Wave Force) of Waves FIG. 13 is a perspective view showing the configuration of a power generation device using a piezoelectric element according to a fifth embodiment of the present invention, and FIGS. 14 and 15 are exploded cross-sectional views taken along the line F-F to illustrate the operation of the external force transfer unit and the stopper unit shown in FIG. 13.

A power generation device using a piezoelectric element according to this embodiment is different from those of the third and fourth embodiments described above in that generation of power is accomplished by using kinetic energy of waves (i.e., a wave force).

To this end, the power generation device using a piezoelectric element according to this embodiment is configured in the shape of a waterwheel, in which an external force transfer unit 141 includes a rotation axis 141c and a plurality of blades 141a arranged in a radial shape centering on the rotation axis 141c.

At this point, since both end portions of the rotation axis 141c are firmly fixed to the supports S which are fixed on the ground, the blade 141a may rotate clockwise or counterclockwise centering on the rotation axis 141c according to advance and retreat of waves.

In addition, although a case of configuring the blade 141a in a panel shape is described in this embodiment as an example, it is not limited thereto, and the blade 141a may be configured in a variety of shapes and numbers as far as performing the same function.

In addition, in FIG. 14, it is preferable that at least some of stopper units 142 are installed between the blades 141a so that the stopper units may collide with the blades 141a and generate an instantaneous impact force of a very high frequency as described in the third and fourth embodiments when the blades 141a rotate centering on the rotation axis 141c by a wave force, which is an external force.

Although a case of configuring the stopper unit 142 in a panel shape and installing the whole stopper unit between the blades 141a is described in this embodiment as an example, it is not limited thereto, and the stopper unit may be configured in a variety of shapes such as a pipe shape and the like, and only some of the stopper units may be configured to collide with the blade 141a as far as performing the same function.

In addition, it is preferable that the stopper unit 142 is fixedly installed so as not to be pushed back when the stopper unit 142 collides with the blade 141a, and in this embodiment, the stopper unit 142 is configured to be fixed to the supports S by the connection bars 142a formed at both ends as an example.

Meanwhile, although a case of installing one stopper unit 142 between the blades 141a is described in this embodiment as an example, it is not limited thereto, and it may be configured to install two or more stopper units 142 between the blades 141a as shown in FIG. 15.

Accordingly, the "stopper unit installed between the blades" in the BEST MODE FOR CARRYING OUT THE INVENTION and the CLAIMS of the present invention is a concept including a case of FIG. 15, as well as a case of FIG. 14.

In addition, since the other configurations related to generation of power using the impact force are the same as those of the third and fourth embodiments, overlapped descriptions will be omitted below.

The piezoelectric element for power generation according to the present invention and a power generation device using the same can be applied to a technical field for generating electricity using a piezoelectric effect, such as a new and renewable energy field, an energy harvest field or the like.

The invention claimed is:
1. A piezoelectric element for power generation, the element comprising:
   a metal thin film;

a piezoelectric material layer fixed to at least any one of a top surface and a bottom surface of the metal thin film; and an electrode layer formed at one side of an outer surface of the piezoelectric material layer, wherein the metal thin film is configured of a flat surface unit to which the piezoelectric material layer is fixed, and an elastic deformation unit configured in a shape extended and bent from a rim of the flat surface unit toward outside to be elastically deformed in a vertical direction of the flat surface unit and generate an impact force when an external force is applied, wherein the element further comprises a reinforcement unit formed at an outer end portion of the elastic deformation unit in order to prevent the flat surface unit from being deformed in accordance with the deformation when the elastic deformation unit is deformed, wherein the reinforcement unit is configured by forming the outer end portion of the elastic deformation unit to be thicker than the other portions.

2. The piezoelectric element according to claim 1, wherein the reinforcement unit is configured by bending the outer end portion of the elastic deformation unit.

3. A power generation device using a piezoelectric element, the device comprising:

at least one of the piezoelectric elements according to claim 1;

a connection member of a bar shape, in which one end portion of a length direction is connected to the piezoelectric element;

a supporting body for fixing the other end portion of the length direction so that the connection member may be formed in a shape of a cantilever; and a charging unit electrically connected to the piezoelectric element to charge electricity generated by the piezoelectric element.

4. The device according to claim 3, wherein a cross section of the connection member is a panel shape, and a strength reinforcement unit bent or thicker than a center portion is formed at both end portions of a width direction in order to reinforce strength.

5. The device according to claim 3, further comprising a weight formed at one end portion of the piezoelectric element to support deformation of at least any one of the metal thin film and the connection member when an external force is applied.

6. The device according to claim 3, wherein a branch member for branching a plurality of piezoelectric elements in a stacked form to be spaced apart from each other and connecting the piezoelectric elements to the connection members is further formed at one end portion of the connection member to which the piezoelectric element is connected.

7. A power generation device using a piezoelectric element, the device comprising:

an external force transfer unit for generating a displacement when an external force is applied;

a stopper unit installed at one side of the external force transfer unit to generate an impact force by collision with the external force transfer unit where the displacement is generated;

a piezoelectric power generation unit installed at least at any one of the external force transfer unit and the stopper unit to generate electricity using a piezoelectric effect obtained by the impact force; and a charging unit for charging the electricity generated by the piezoelectric power generation unit, wherein the external force transfer unit includes a rotation axis and a rotation member of a bar shape having a middle one end portion combined with the rotation axis so that both end portions may rotate centering on the rotation axis, and the stopper unit is installed to collide with the other end portion of the rotation member when one end portion of the rotation member rotates by an external force.

8. The device according to claim 7, wherein the external force is a kinetic energy of a traveling train, and a kinetic energy transfer member for transferring the kinetic energy at a time of traveling to one end portion of the rotation member is installed at one side of the train.

9. The device according to claim 7, wherein the external force is a load energy of a vehicle traveling on a ground surface, and a load energy transfer member for transferring the load energy transferred through a wheel of the vehicle to one end portion of the rotation member is installed on the road surface.

10. The device according to claim 7, wherein the external force transfer unit is formed in a waterwheel shape including a rotation axis and a plurality of blades arranged in a radial shape centering on the rotation axis, and at least some of stopper units are installed between the blades so that the stopper units may collide with the blades when the blades rotate centering on the rotation axis by a wave force, which is an external force.

11. The device according to claim 7, wherein the piezoelectric power generation unit is configured to include a piezoelectric element and a connection member for transferring the impact force to the piezoelectric element, in which one end portion of the connection member is connected to the piezoelectric element and the other end portion is connected to the external force transfer unit or the stopper unit, wherein the piezoelectric element includes a metal thin film; a piezoelectric material layer fixed to at least any one of a top surface and a bottom surface of the metal thin film; and an electrode layer formed at one side of an outer surface of the piezoelectric material layer.

* * * * *